(12) United States Patent
Huang et al.

(10) Patent No.: US 11,264,326 B2
(45) Date of Patent: Mar. 1, 2022

(54) CONTACT VIA FORMATION

(71) Applicant: Taiwan Semiconductor Manufacturing Co., Ltd., Hsin-Chu (TW)

(72) Inventors: Lin-Yu Huang, Hsinchu (TW); Li-Zhen Yu, New Taipei (TW); Kuan-Lun Cheng, Hsin-Chu (TW); Chih-Hao Wang, Baoshan Township (TW); Cheng-Chi Chuang, New Taipei (TW); Chia-Hao Chang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/888,381

(22) Filed: May 29, 2020

(65) Prior Publication Data

US 2021/0375758 A1    Dec. 2, 2021

(51) Int. Cl.
*H01L 23/528* (2006.01)
*H01L 21/768* (2006.01)
*H01L 23/522* (2006.01)
*H01L 21/3213* (2006.01)

(52) U.S. Cl.
CPC .... *H01L 23/5283* (2013.01); *H01L 21/32139* (2013.01); *H01L 21/76885* (2013.01); *H01L 23/5226* (2013.01)

(58) Field of Classification Search
CPC ......... H01L 21/32139; H01L 21/76885; H01L 23/5226
See application file for complete search history.

(56) References Cited

U.S. PATENT DOCUMENTS

| | | |
|---|---|---|
| 9,520,362 B2 | 12/2016 | Lin et al. |
| 9,613,856 B1 | 4/2017 | Yang et al. |
| 9,716,032 B2 | 7/2017 | Tang et al. |
| 9,972,529 B2 | 5/2018 | Yang et al. |
| 10,163,691 B2 | 12/2018 | Shih et al. |
| 10,170,322 B1 | 1/2019 | Cheng et al. |
| 10,833,017 B2 * | 11/2020 | Liu .................... H01L 23/53238 |
| 10,886,361 B2 * | 1/2021 | Kim .................... H01L 21/76804 |
| 11,043,418 B2 * | 6/2021 | Stephens ............. H01L 23/5226 |
| 2009/0170308 A1 * | 7/2009 | Shim .................... H01L 23/5283 438/637 |
| 2013/0069238 A1 * | 3/2013 | Usami ............... H01L 23/53257 257/769 |
| 2020/0006525 A1 * | 1/2020 | Crum .................... H01L 29/785 |

* cited by examiner

*Primary Examiner* — Karen Kusumakar
(74) *Attorney, Agent, or Firm* — Haynes and Boone, LLP

(57) ABSTRACT

Semiconductor devices and methods of forming the same are provided. In one embodiment, a semiconductor device includes an active region including a channel region and a source/drain region and extending along a first direction, and a source/drain contact structure over the source/drain region. The source/drain contact structure includes a base portion extending lengthwise along a second direction perpendicular to the first direction, and a via portion over the base portion. The via portion tapers away from the base portion.

20 Claims, 18 Drawing Sheets

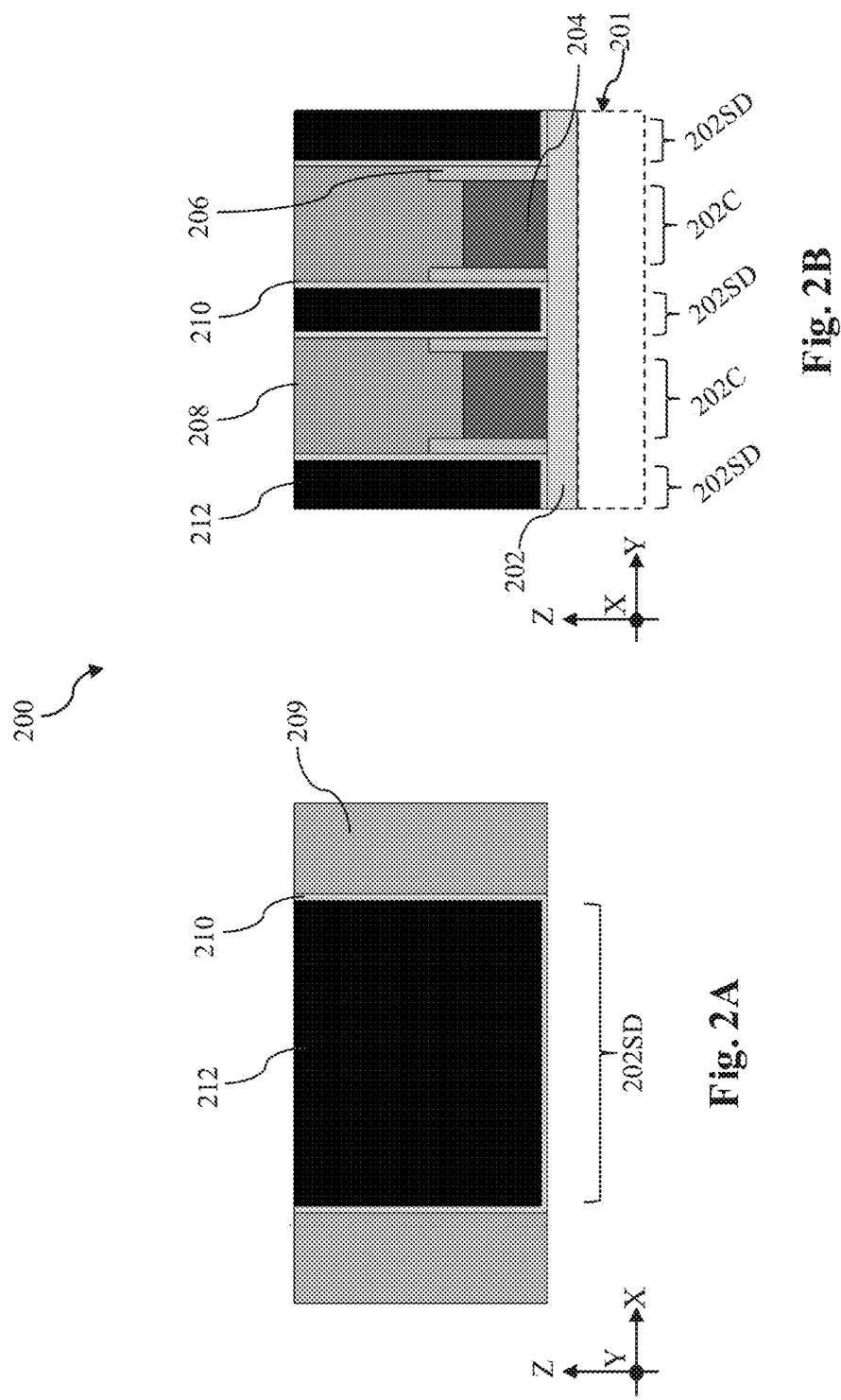

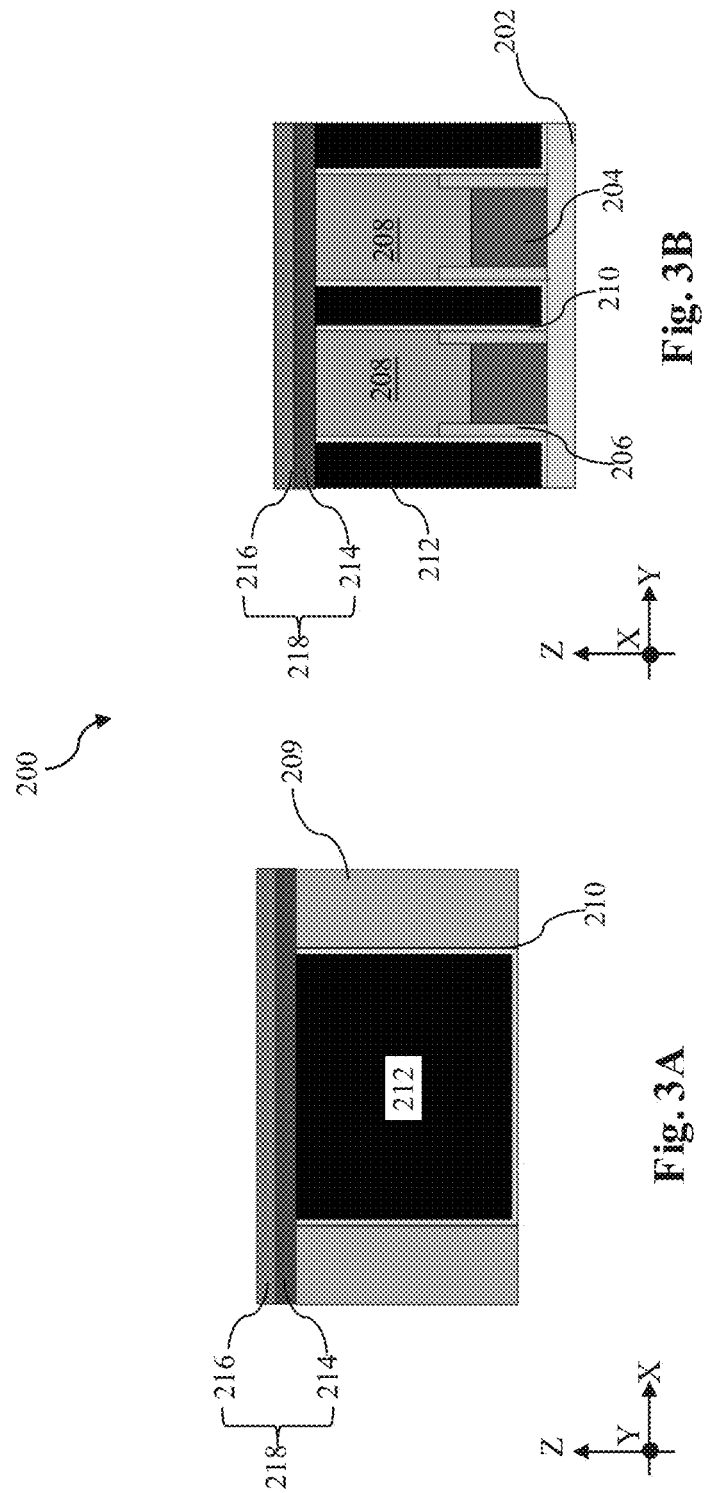

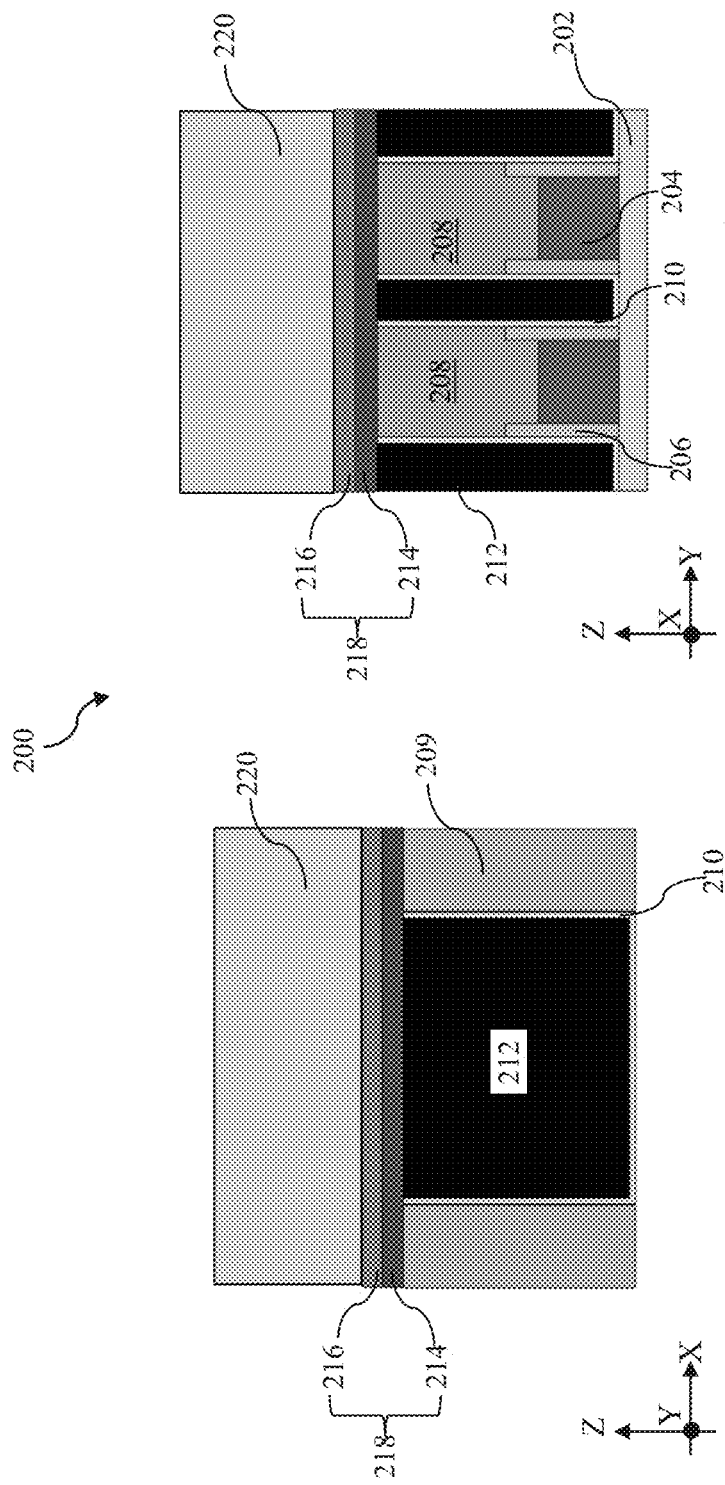

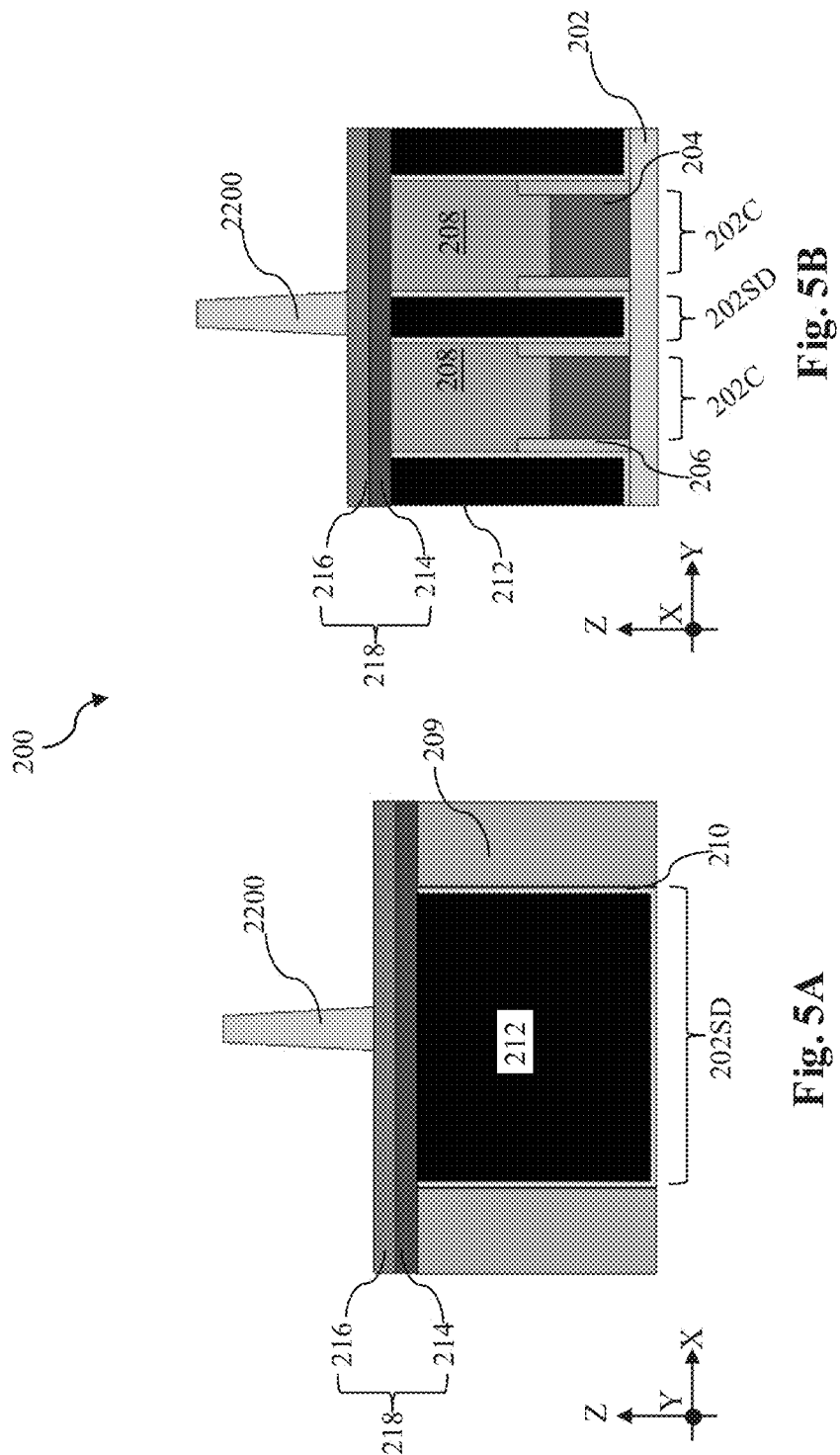

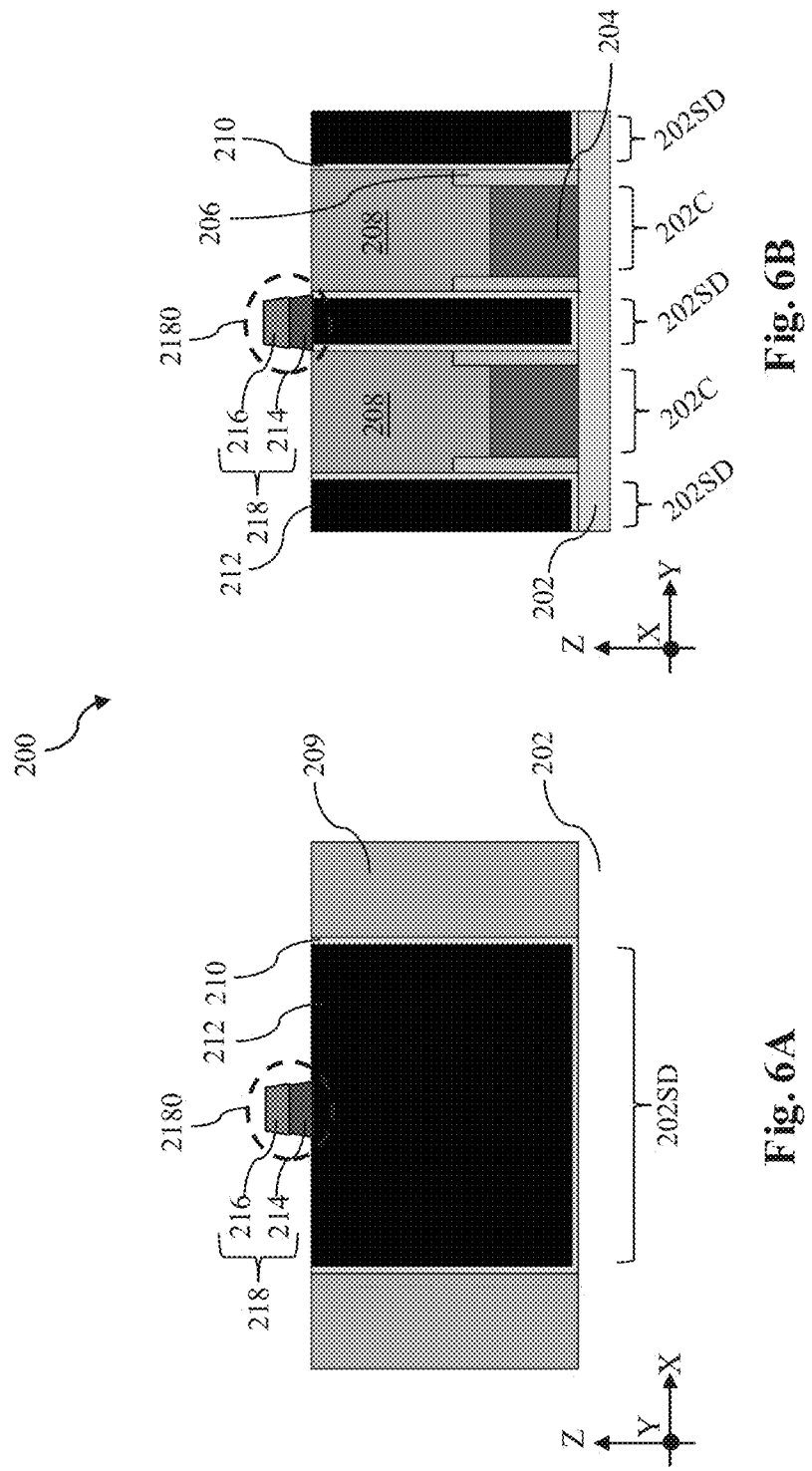

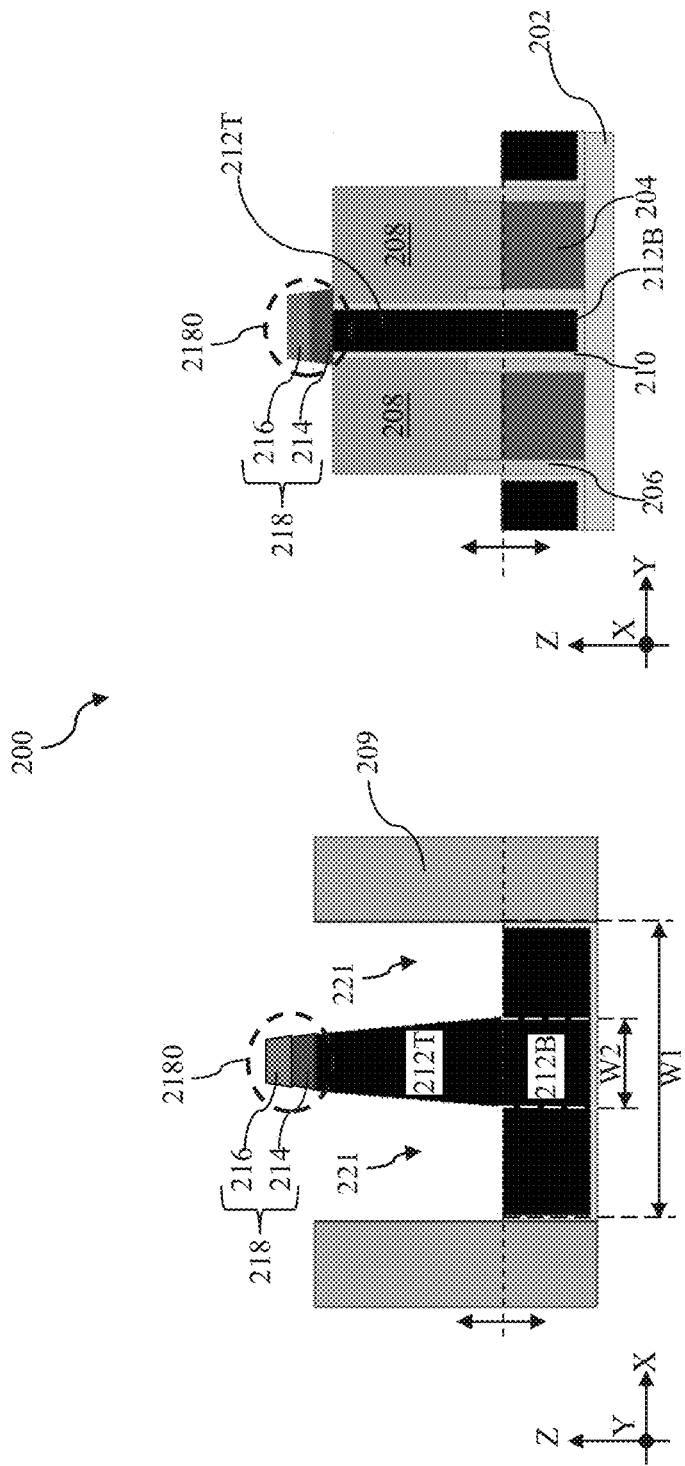

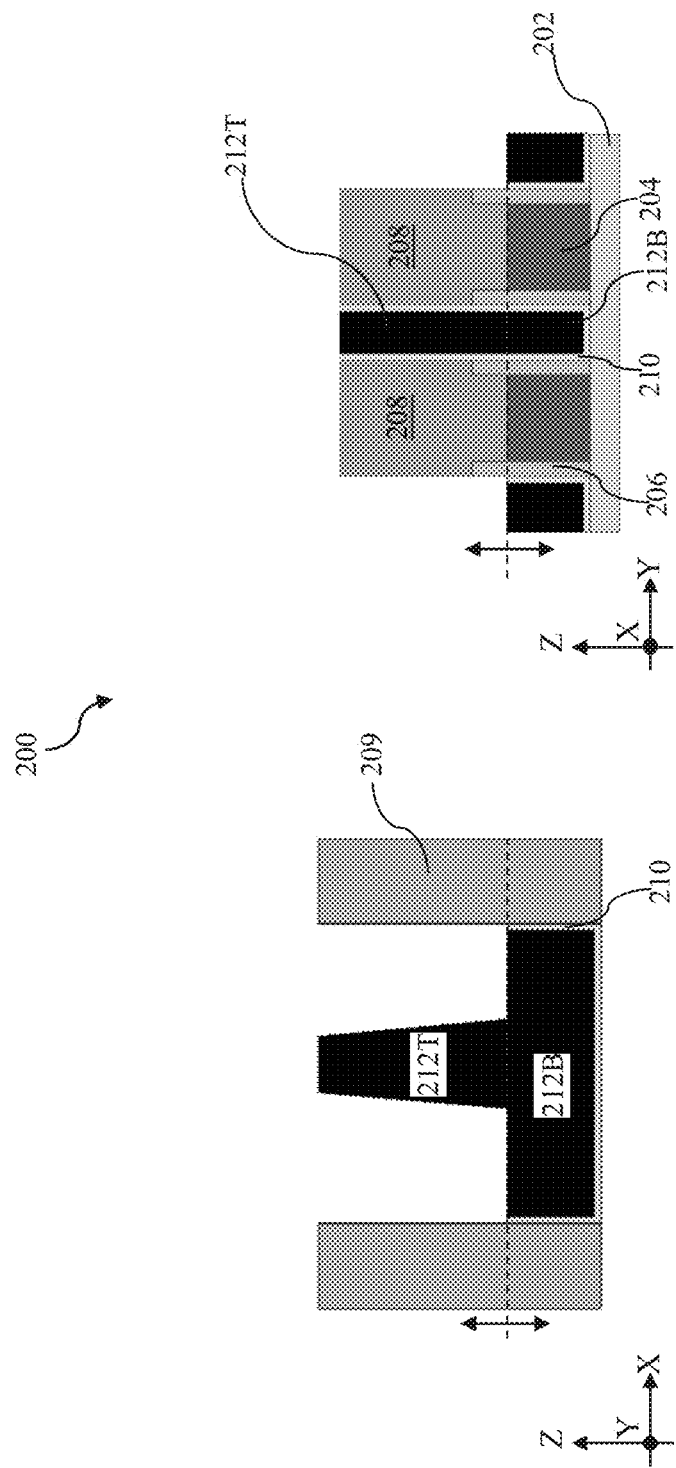

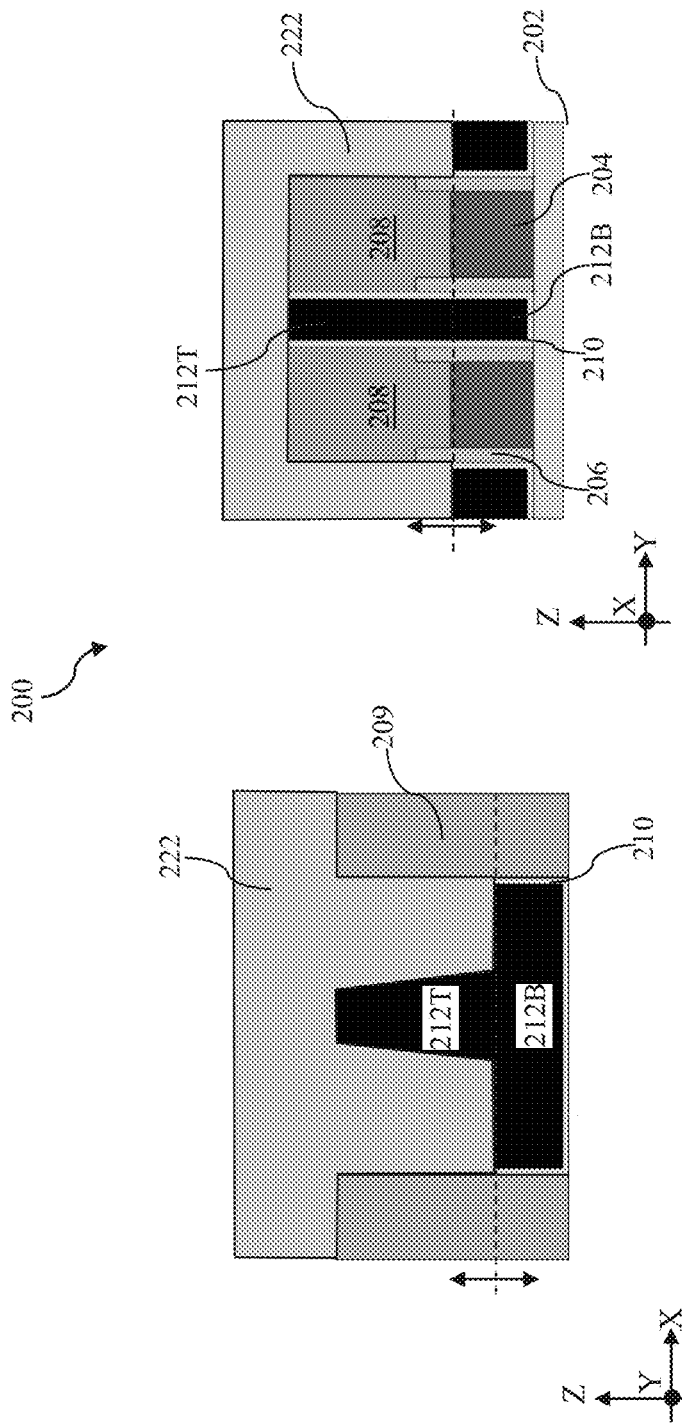

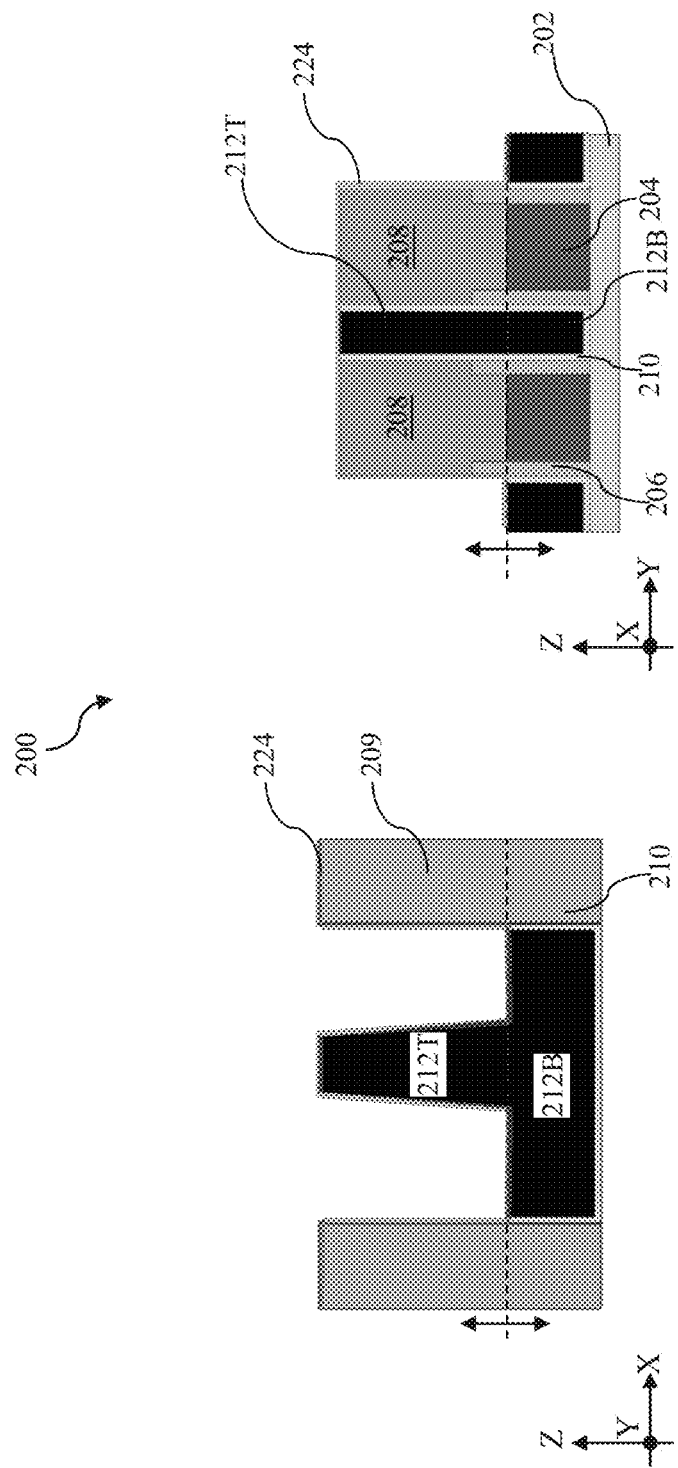

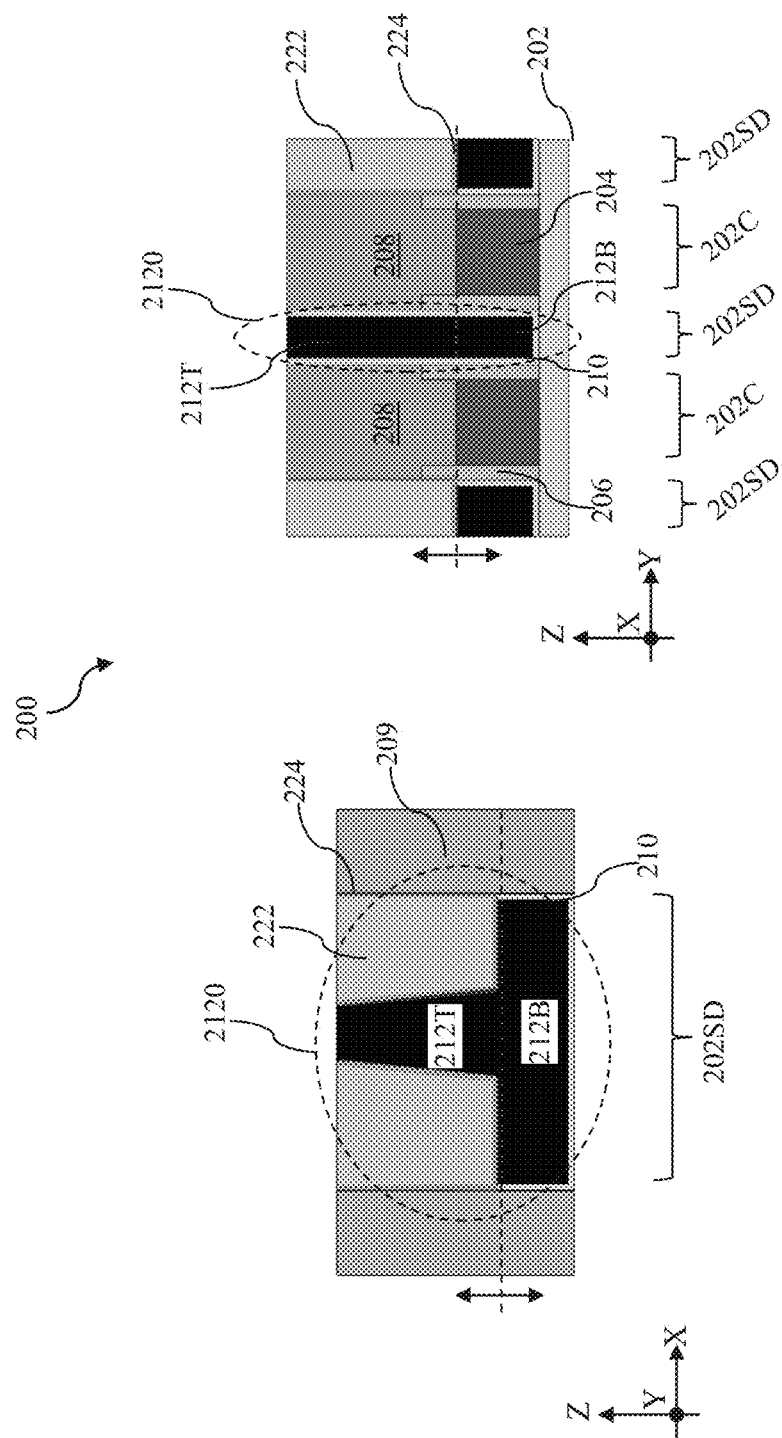

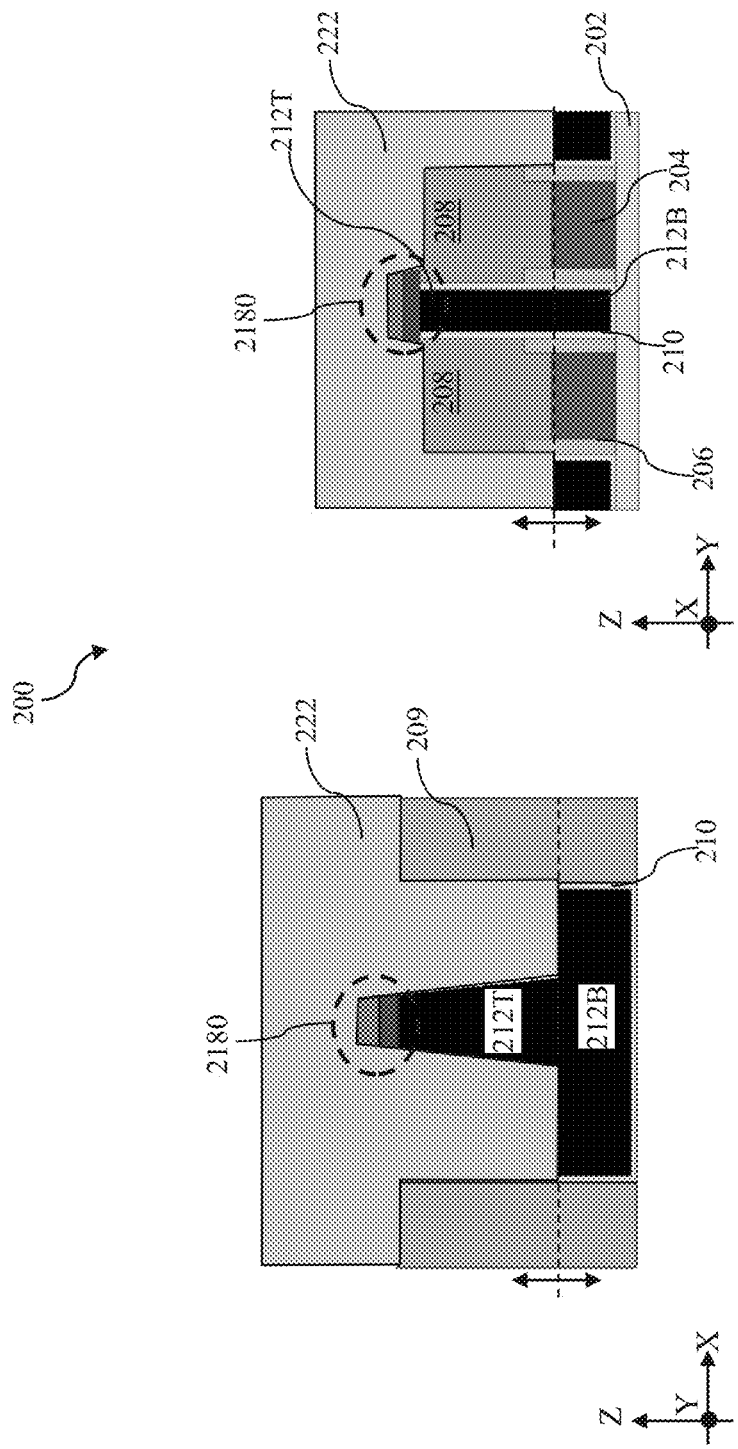

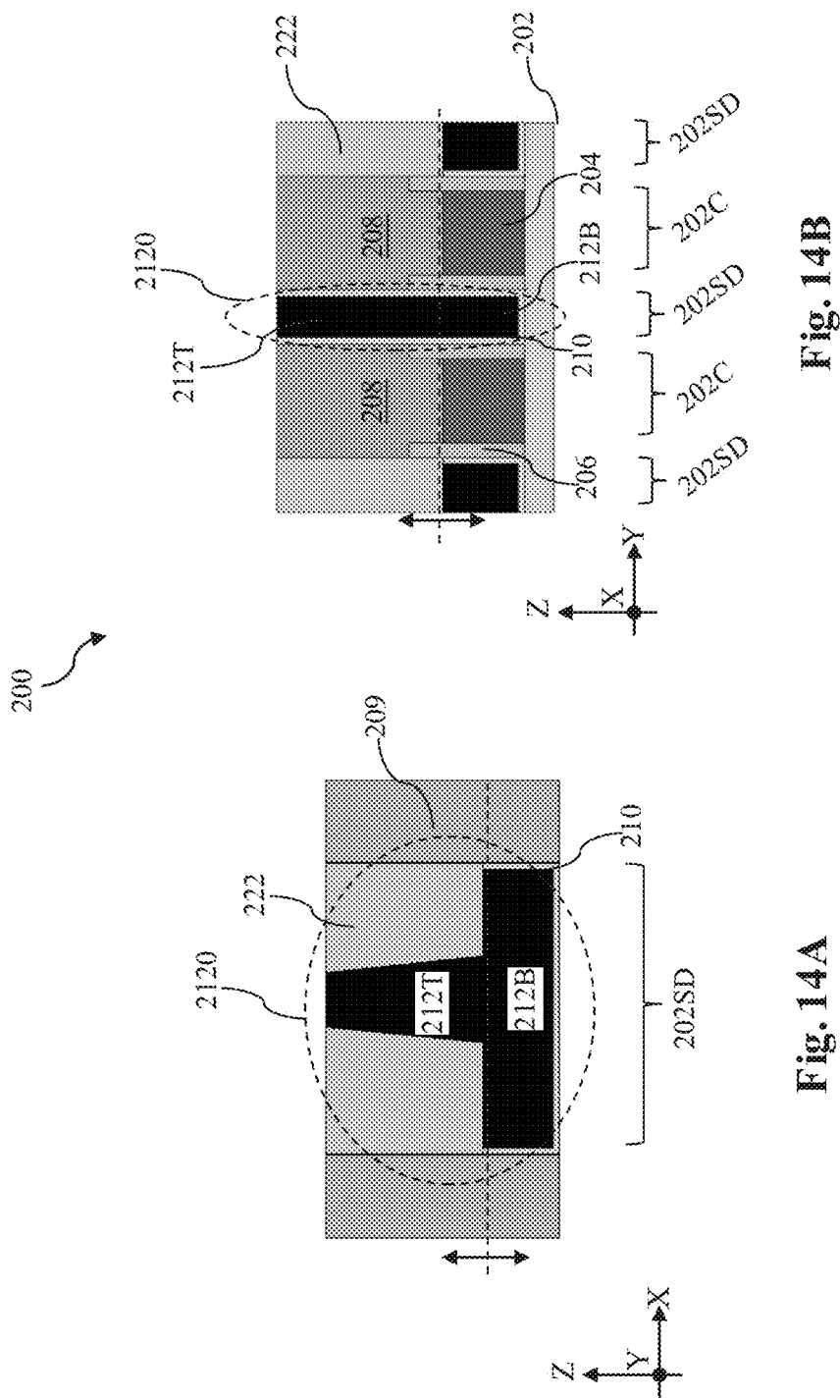

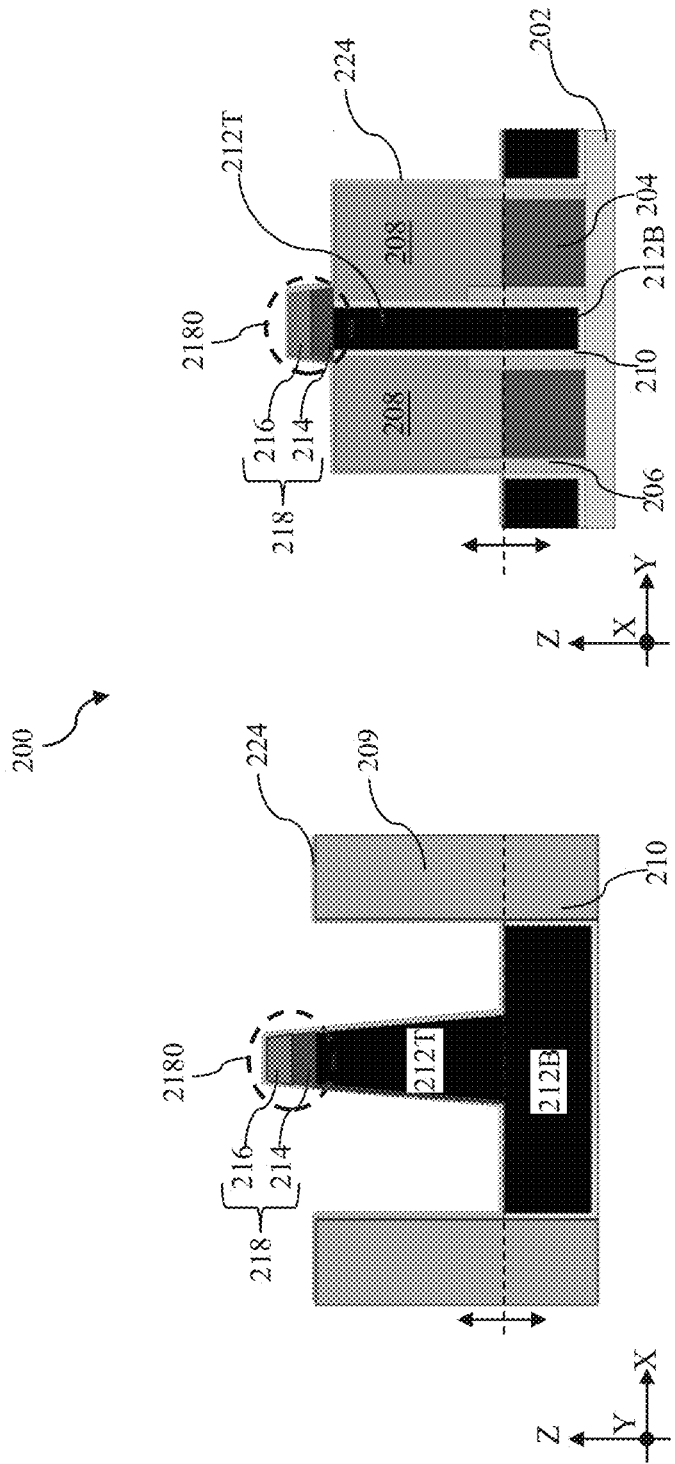

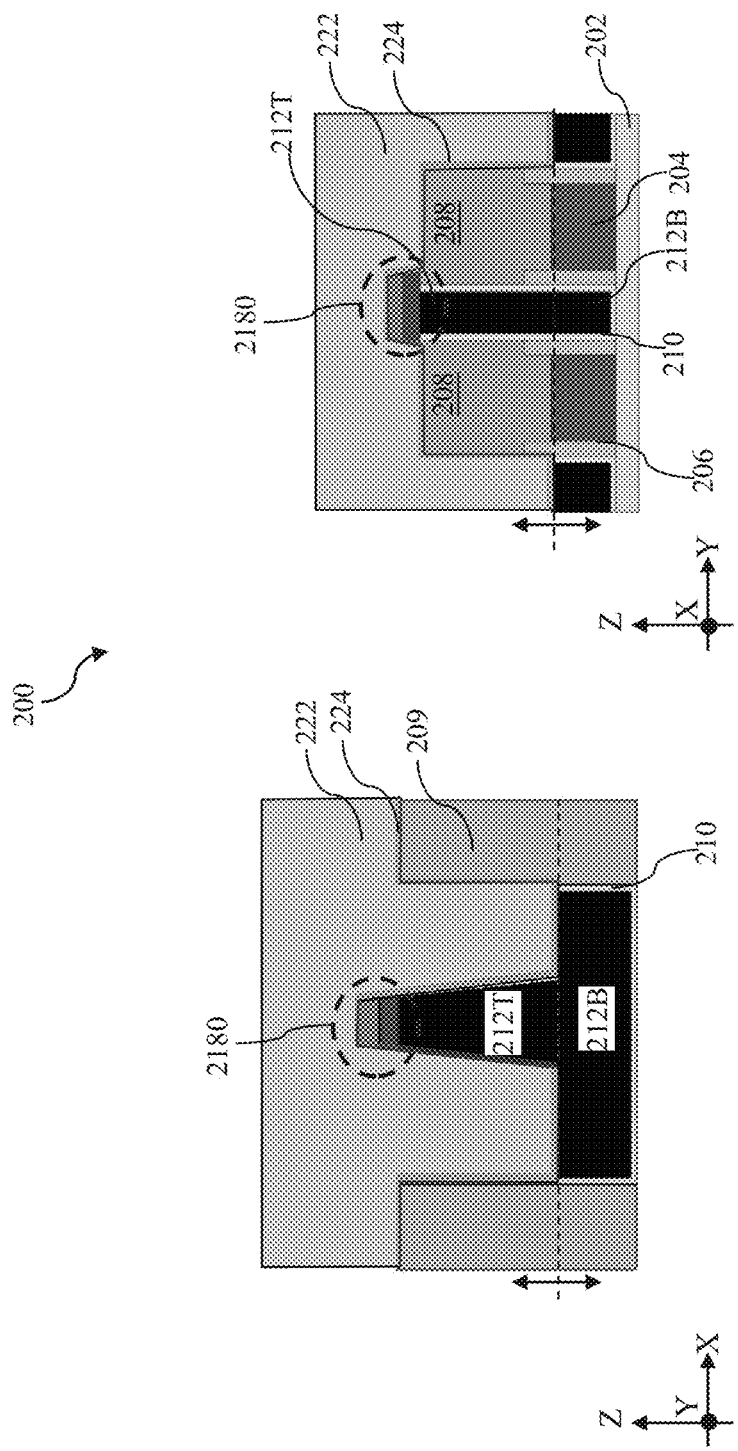

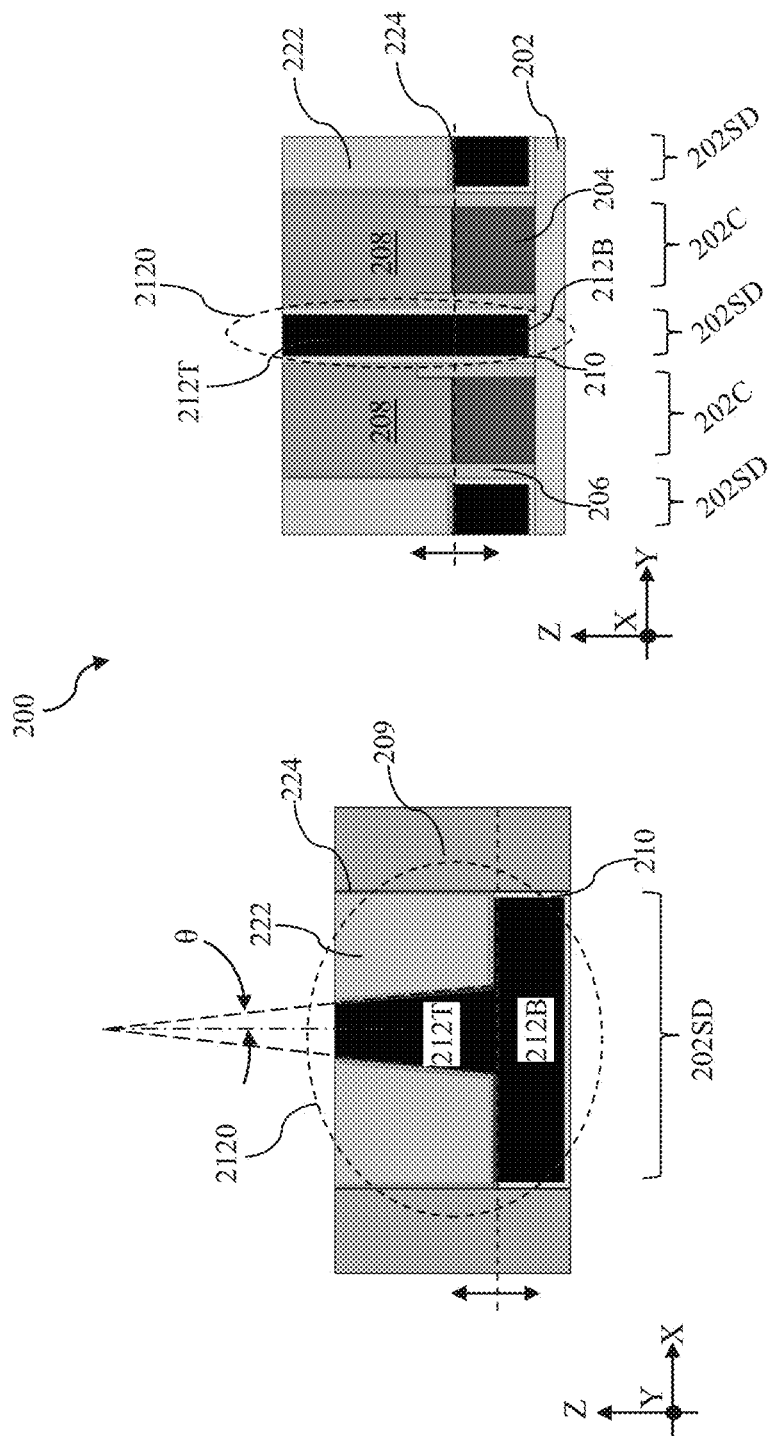

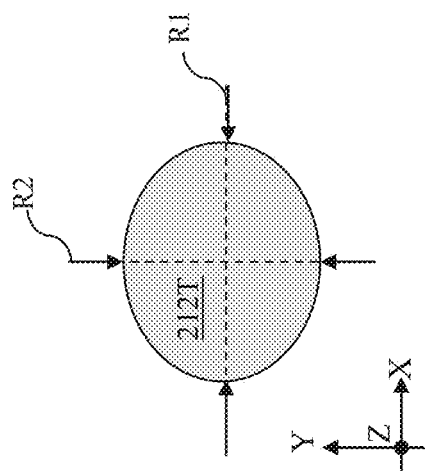
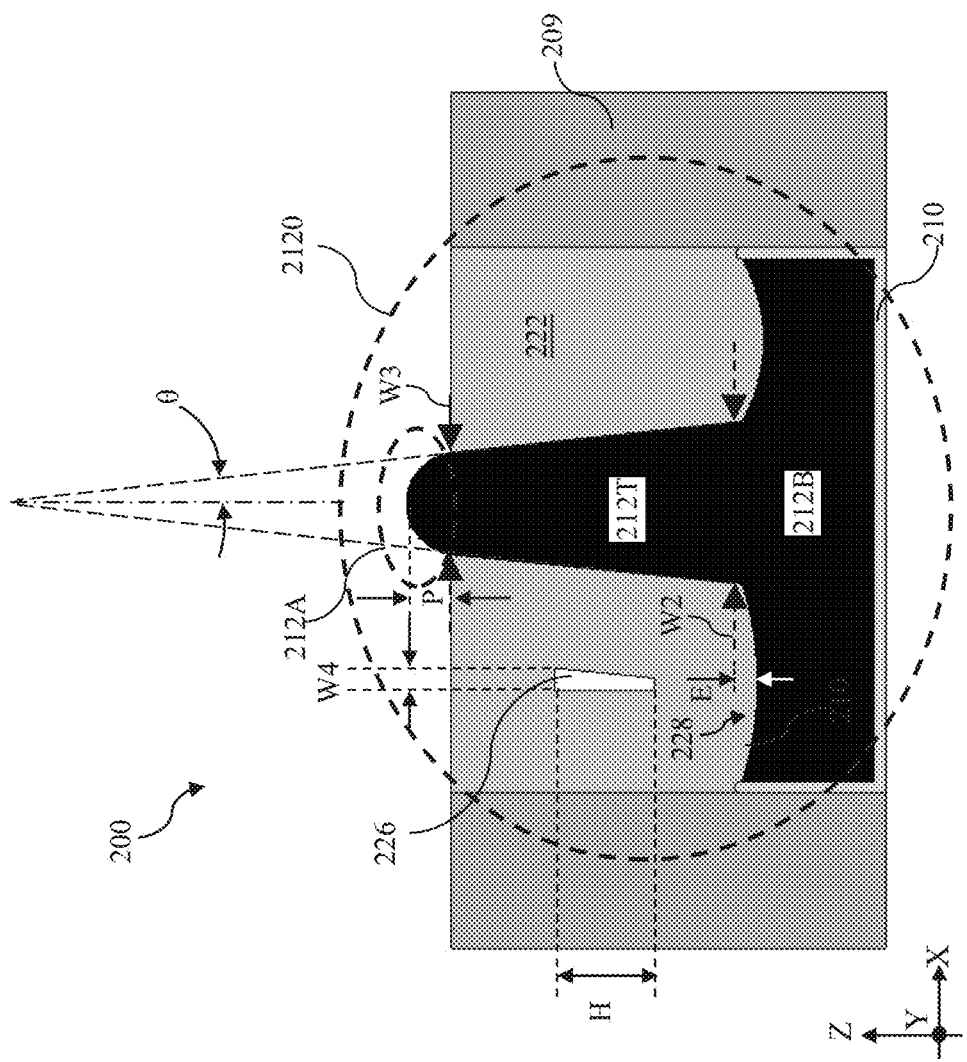

CONTACT VIA FORMATION

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Multi-gate devices, such as fin field-effect transistors (FinFETs) and multi-bridge channel (MBC) transistors (also known as gate-all-around (GAA) transistors, surrounding gate transistors (SGTs), nanowire transistors, or nanosheet transistors), have been introduced in an effort to improve gate control by increasing gate-channel coupling, reduce OFF-state current, and reduce short-channel effects (SCEs). The three-dimensional structure of the multi-gate devices, allows them to be aggressively scaled while maintaining gate control and mitigating SCEs. However, even with the introduction of multi-gate devices, aggressive scaling down of IC dimensions has resulted in densely spaced gate structures and source/drain contacts. Formation of source/drain contact vias may require formation of high-aspect-ratio source/drain contact via openings, which may present process challenges. Depositing various layers in the source/drain contact via openings may also be challenging. An earlier deposited material, such as a glue layer or a barrier layer, may close off the passage or prevent satisfactory deposition of a subsequently deposited material, such as a metal fill material. Therefore, although conventional methods for forming source/drain contact vias are generally adequate for their intended purposes, they are not satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, and 17B are fragmentary cross-sectional views of a workpiece at various stages of fabrication according to the method in FIG. 1, according to one or more aspects of the present disclosure.

FIG. 18 is a fragmentary cross-sectional view of a source/drain contact structure in a semiconductor device, according to one or more aspects of the present disclosure.

FIG. 19 is a fragmentary top view of a via portion of a source/drain contact structure in a semiconductor device, according to one or more aspects of the present disclosure.

DETAILED DESCRIPTION

Figure 1:
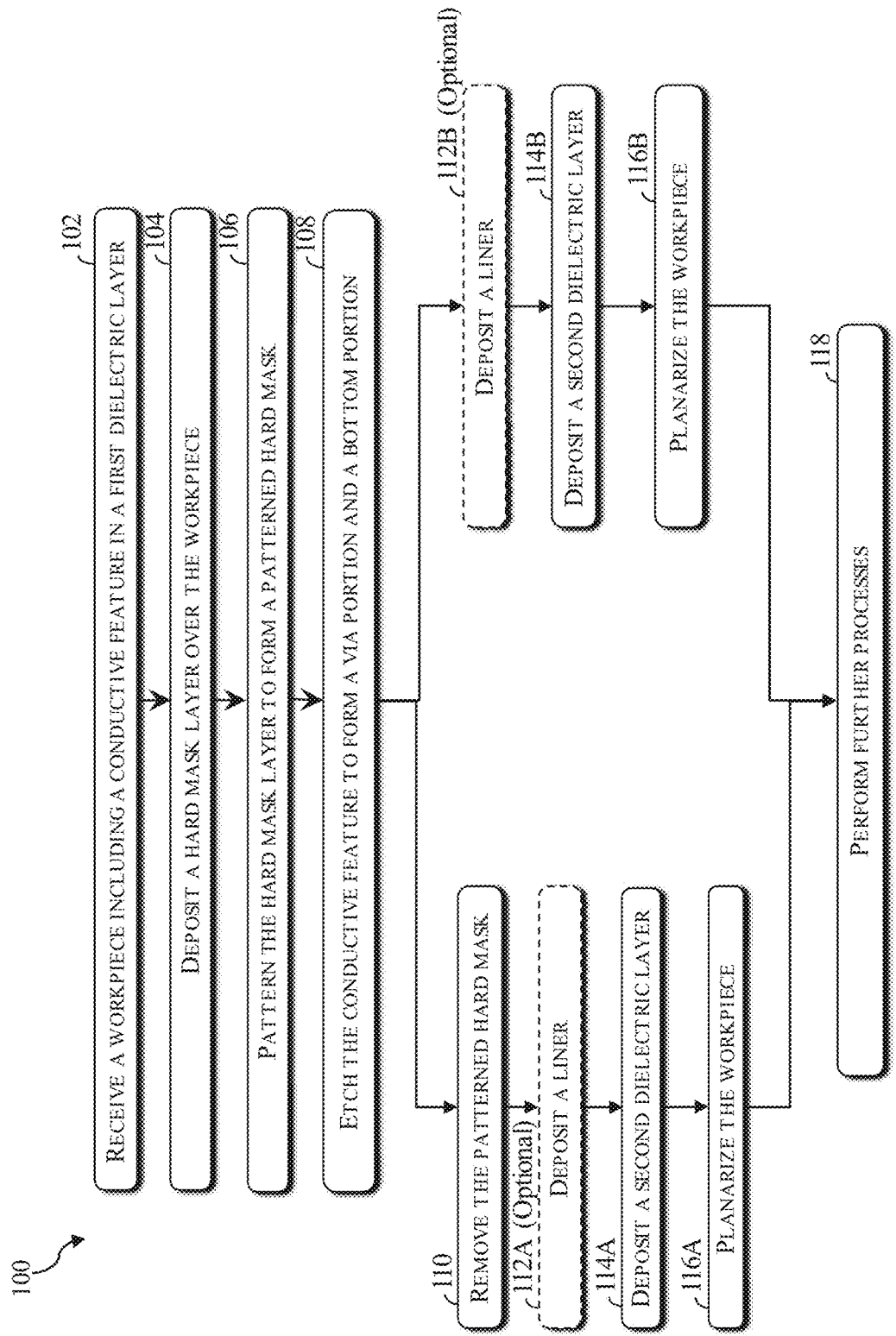
FIG. 1 is a flowchart of a method forming a source/drain contact structure in a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present application relates to semiconductor device structures and methods of forming the same. Particularly, the present application relates to a source/drain contact structure and methods of forming the same.

In conventional techniques to form multi-gate devices, a source/drain contact is first formed over a source/drain feature, a dielectric layer is formed over the source/drain contact, and a source/drain contact via is formed through the dielectric layer to couple to the source/drain contact. To form the source/drain contact via, a source/drain contact via opening is first formed in the dielectric layer and various materials are sequentially deposited in the source/drain contact via opening to form the source/drain contact via. Such various materials may include, for example, a barrier layer, a glue layer, or a metal fill layer. The barrier layer functions to prevent the metal fill layer from degradation and the glue layer functions to promote adhesion of the metal fill layer to the dielectric layer. In some example, a single layer may serve as both a glue layer and a barrier layer. When gate structures and source/drain contacts become more and more densely packed in modern-day multi-gate devices, the source/drain contact via opening may have a high aspect ratio. High-aspect-ratio contact via openings may present two challenges. For one, they may be difficult to form. For another, when the barrier layer or glue layer is deposited into a high-aspect-ratio via opening, it may block the passage to the via opening, resulting in voids and unsatisfactory filling of the metal fill layer. Because the barrier layer or the glue layer is less conductive than the metal fill layer, its presence at the interface between the source/drain contact and the metal fill layer may increase the contact resistance.

The present disclosure provides a continuous source/drain contact structure and methods of forming the same. The source/drain contact structure of the present disclosure includes a via portion extending continuously from a base portion. The via portion serves as a source/drain contact via and the base portion serves as a source/drain contact. Methods of the present disclosure include depositing a conductive feature in a source/drain contact trench over a source/drain feature. A top portion of the contact feature is patterned into a via portion and a base portion of the contact feature becomes a base portion. A dielectric layer is deposited along sidewalls of the via portion. A liner may be optionally formed between the via portion and the dielectric layer to prevent degradation of the via portion. Formation of the source/drain contact structure according to the present disclosure requires neither formation of high-aspect-ratio via openings nor a barrier layer (or a glue layer) interposing between the source/drain contact and the source/drain contact via. Source/drain contact structures of the present disclosure therefore may improve device performance and methods of the present disclosure may have a larger process window.

The various aspects of the present disclosure will now be described in more detail with reference to the figures. Specifically, FIG. 1 illustrates a method 100 for fabricating a semiconductor device from a workpiece 200, fragmentary cross-sectional views of which are illustrated in FIGS. 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B, 17A, and 17B. Each of drawings ending with an "A" includes a first cross-sectional view along a first direction (i.e., Y direction) and each of drawings ending with an "B" includes a second cross-sectional view along a second direction (i.e., X direction) perpendicular to the first direction. Method 100 is merely an example and is not intended to limit the present disclosure to what is explicitly illustrated therein. Additional steps can be provided before, during, and after method 100, and some steps described can be replaced, eliminated, or moved around for additional embodiments of the method. Not all steps are described herein in detail for reasons of simplicity. Besides what are explicitly shown in figures of the present disclosure, the workpiece 200 may include additional transistors, bipolar junction transistors, resistors, capacitors, diodes, fuses, etc., but is simplified for a better understanding of the inventive concepts of the present disclosure. Throughout the present disclosure, like reference numerals denote like features unless otherwise excepted or described. Because a semiconductor device will be fabricated from the workpiece, the workpiece 200 may be referred to as a semiconductor device 200 in suitable context.

Referring to FIGS. 1, 2A and 2B, method 100 includes a block 102 where a workpiece 200 is received. As shown in FIG. 2B, the workpiece 200 includes an active region 202 disposed over a substrate 201. The active region 202 includes channel regions 202C and source/drain regions 202SD. Each of the channel regions 202C is disposed below a gate structure 204. Although not explicitly shown, the active region 202 extends lengthwise along the Y direction and the gate structure 204 extends lengthwise along the X direction, which is perpendicular to the Y direction. Gate spacer layers 206 extend along sidewalls of the gate structures 204. A gate self-aligned contact (SAC) dielectric feature 208 is disposed over each of the gate structure 204 and the gate spacer layers 206 adjacent the gate structure 204. The workpiece 200 also includes conductive features 212 disposed over source/drain regions 202SD. As shown in FIGS. 2A and 2B, the conductive feature 212 is disposed between two portions of a first dielectric layer 209 along the X direction and between two gate structures 204 along the Y direction. As shown in FIG. 2B, the conductive feature 212 extends continuously along a sidewall of the gate spacer layer 206 and a sidewall of the gate SAC dielectric feature 208. In some embodiments illustrated in FIGS. 2A and 2B, a glue layer 210 is deposited between the conductive feature 212 and adjacent structures, such as the first dielectric layer 209, the source/drain region 202SD of the active region 202, the sidewall of the gate spacer layer 206, and the sidewall of the gate SAC dielectric feature 208. For simplicity of illustration, the substrate 201 is only illustrated in FIG. 2B and is omitted from the other figures.

In the present disclosure, the active region 202 may represent a fin structure of a FinFET or a stack of channel members in an MBC transistor. While not explicitly shown, the active region 202 may include source/drain features in the source/drain regions 202SD. The source/drain features may include epitaxial features, such as silicon epitaxial features doped with an n-type dopant or a silicon germanium epitaxial feature doped with a p-type dopant. Example n-type dopants may include phosphorus or arsenide. Example p-type dopants may include boron. In the channel regions 202C, the active region 202 may include silicon or silicon germanium. The substrate 201 may be a semiconductor substrate such as a silicon substrate. The substrate 201 may include various layers, including conductive or insulating layers formed on a semiconductor substrate. The substrate 201 may include various doping configurations depending on design requirements as is known in the art. The substrate 201 may also include other semiconductors such as germanium, silicon carbide (SiC), silicon germanium (SiGe), or diamond. In some implementations, the substrate 201 may include a silicon-on-insulator (SOI) structure, and/or the substrate 201 may have other suitable enhancement features.

While not explicitly shown in FIGS. 2A and 2B, each of the gate structures 204 includes an interfacial layer, a gate dielectric layer, one or more work function layers, and a metal fill layer. In some embodiments, the interfacial layer may include a dielectric material such as silicon oxide layer or silicon oxynitride. The gate dielectric layer is formed of a high-k (dielectric constant greater than about 3.9) dielectric material that may include $HfO_2$, $TiO_2$, $HfZrO$, $Ta_2O_3$, $HfSiO_4$, $ZrO_2$, $ZrSiO_2$, combinations thereof, or other suitable materials. The one or more work function layers may include n-type work function layers and p-type work function layers. Example n-type work function layers may be formed of aluminum, titanium aluminide, titanium aluminum carbide, tantalum silicon carbide, tantalum silicon aluminum, tantalum silicon carbide, tantalum silicide, or hafnium carbide. Example p-type work function layers may be formed of titanium nitride, titanium silicon nitride, tantalum nitride, tungsten carbonitride, or molybdenum. The metal fill layer may be formed of a metal, such as tungsten (W), ruthenium (Ru), cobalt (Co) or copper (Cu). Because the gate dielectric layer is formed of high-k dielectric material and the use of metal in gate structures 204, gate structures 204 may also be referred to high-k metal gate structures 204 or metal gate structures 204.

The first dielectric layer 209 may be an interlayer dielectric (ILD) layer. The first dielectric layer 209 may be a silicon oxide or silicon oxide containing material where silicon exists in various suitable forms. As an example, the ILD layer includes silicon oxide or a low-k dielectric material whose k-value (dielectric constant) is smaller than that of silicon oxide, which is about 3.9. In some embodiments, the low-k dielectric material includes a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOCN), spin-on silicon based polymeric dielectrics, or combinations thereof.

In some embodiments, the gate spacer layer 206 may be a single layer or a multi-layer. Example materials for the gate spacer layer 206 include silicon oxide, hafnium silicide, silicon oxycarbide, aluminum oxide, zirconium silicide, aluminum oxynitride, zirconium oxide, hafnium oxide, titanium oxide, zirconium aluminum oxide, zinc oxide, tantalum oxide, lanthanum oxide, yttrium oxide, tantalum carbonitride, silicon nitride, silicon oxycarbonitride, silicon, zirconium nitride, or silicon carbonitride. The material for the gate spacer layer 206 is selected such that the gate spacer layer and the first dielectric layer 209 have different etching selectivity. That is, the selection of materials allows each of the gate spacer layer 206 or the first dielectric layer 209 to be selectively etched without substantially damaging the other. In one example, the gate spacer layer 206 is formed of silicon oxycarbonitride.

In the embodiments represented in FIGS. 2A and 2B, the conductive feature 212 may include a metal, a metal nitride, a metal silicide, or a metal silicide nitride. For example, the conductive feature 212 may be formed of cobalt (Co), tungsten (W), ruthenium (Ru), aluminum (Al), molybdenum (Mo), titanium (Ti), titanium nitride (TiN), titanium silicide (TiSi), cobalt silicide (CoSi), nickel silicide (NiSi), copper (Cu), tantalum nitride (TaN), nickel (Ni), or titanium silicide nitride (TiSiN). When the conductive feature 212 is formed of a metal material that may degrade due to direct contact with the first dielectric layer 209, such as copper and aluminum, the glue layer 210 may be formed between the conductive feature 212 and the first dielectric layer 209, between the gate spacer layer 206 and the conductive feature 212, and between the gate SAC dielectric feature 208 and the conductive feature 212. In some embodiments, the glue layer 210 may be formed of cobalt (Co), molybdenum (Mo), titanium (Ti), titanium nitride (TiN), titanium silicide (TiSi), cobalt silicide (CoSi), nickel silicide (NiSi), tantalum nitride (TaN), nickel (Ni), or titanium silicide nitride (TiSiN). A composition of the glue layer 210 is different from a composition of the conductive feature 212 in order for the glue layer 210 to serve its purpose. When a glue layer 210 is implemented, a material forming the conductive feature 212 may be more conductive than a material forming the glue layer 210. In one embodiment, the glue layer includes titanium nitride (TiN) and the conductive feature includes cobalt (Co), tungsten (W), ruthenium (Ru), aluminum (Al), molybdenum (Mo), titanium (Ti), copper (Cu), or nickel (Ni).

Referring to FIGS. 1, 3A and 3B, method 100 includes a block 104 where a hard mask layer 218 is deposited over the workpiece 200. The hard mask layer 218 may be a single layer or a multilayer. In some embodiments represented in FIGS. 3A and 3B, the hard mask layer 218 includes a first hard mask layer 214 and a second hard mask layer 216 disposed over the first hard mask layer 214. In one implementations, the first hard mask layer 214 may include silicon oxide and the second hard mask layer 216 may include silicon nitride or silicon oxynitride. The hard mask layer 218 may be deposited using chemical vapor deposition (CVD) or atomic layer deposition (ALD).

Referring to FIGS. 1, 4A, 4B, 5A, 5B, 6A, and 6B, method 100 includes a block 106 where the hard mask layer 218 is patterned to form a patterned hard mask 2180. As shown in FIGS. 4A and 4B, at block 106, a photoresist layer 220 is deposited over the hard mask layer 218 using spin-on coating or a suitable method. The photoresist layer 220 may be a single layer or a multi-layer. For example, the photoresist layer 220 may by a tri-layer having three layers. Referring to FIGS. 5A and 5B, the photoresist layer 220 is patterned using photolithography processes to form a patterned photoresist layer 2200. As shown in FIGS. 5A and 5B, the patterned photoresist layer 2200 may resemble a rod or a post. Along the X direction, the patterned photoresist layer 2200 only covers a portion of the conductive feature while it substantially covers the span of the conductive feature 212 along the Y direction. Put differently, along the Y direction, the patterned photoresist layer 2200 is disposed directly over the conductive feature 212 in the source/drain region 202SD but does not extend over the channel regions 202C.

Referring now to FIGS. 6A and 6B, the hard mask layer 218 is then etched using the patterned photoresist layer 2200 as an etch mask to form the patterned hard mask 2180. As shown in FIGS. 6A and 6B, the patterned hard mask 2180 may resemble an island. Similar to the patterned photoresist layer 2200, the patterned hard mask 2180 only covers a portion of the conductive feature 212 along the X direction while covers the entire span of the conductive feature 212 along the Y direction. Along the Y direction, the patterned hard mask 2180 does not extend over the gate SAC dielectric features 208 in the channel regions 202C.

Referring to FIGS. 1, 7A and 7B, method 100 includes a block 108 where the conductive feature 212 is etched to form a via portion 212T and a base portion 212B. At block 108, the conductive feature 212 is selectively etched in a dry etch process that uses an etchant that contains oxygen, chlorine, or fluorine elements. For example, the etchant may include a gas mixture of chlorine ($Cl_2$), Oxygen ($O_2$), a carbon-and-fluorine containing gas, a bromine-and-fluorine containing gas, and a carbon-hydrogen-and-fluorine containing gas. In one example, the etchant includes a gas mixture of $Cl_2$, $O_2$, $CF_4$, $BCl_3$, and $CHF_3$. As shown in FIG. 7A, because the patterned hard mask 2180 only covers a portion of the conductive feature 212 along the X direction, the etching at block 108 may result in two recesses 221 extending into the conductive feature 212. As a result, operations at block 108 pattern the conductive feature 212 into a via portion 212T disposed over and connected to a base portion 212B. Along the X-Z plane, the via portion 212T is defined by and disposed between the two recesses 221. Because the via portion 212T and the base portion 212B are formed from the same conductive feature 212, they are continuous or one-piece. As compared to some conventional structures where a source/drain contact via interfaces a source/drain contact by a less conductive barrier layer (or glue layer), the continuity of the via portion 212T and the base portion 212B of the present disclosure provides reduced contact resistance. As illustrated in FIGS. 7A and 7B, because the via portion 212T is above the dotted line and the base portion 212B is below the dotted line. The via portion 212T may also be referred to as a top portion and the base portion 212B may also be referred to as a bottom portion. Along the X direction, the base portion 212B has a first width W1 and the via portion 212T has a second width W2 at its interface with the base portion 212B. The second width W2 is smaller than the first width W1. In some instances, a ratio of the first width W1 to the second width W2 may be between about 5 and about 30. Because the via portion 212T is formed by etching the conductive feature 212 from the top, the via portion 212T tapers away from the base portion 212B. That is, a bottom end of the via portion 212T (adjacent the interface with the base portion 212B) is wider than a top end of the via portion 212T, along the X direction.

Reference is now made to FIG. 1. The present disclosure provides multiple alternative processes after block 108. In one embodiment, the method 100 proceed from block 108 to block 110 where the patterned hard mask 2180 is selectively removed before a second dielectric layer 222 is deposited alongside the via portion 212T and planarized. In some implementations, a liner 224 may be deposited over the workpiece 200 after the patterned hard mask 2180 is removed but before the deposition of the second dielectric layer 222. In another embodiment, the method 100 may alternatively proceed from block 108 to block 114B where the second dielectric layer 222 is deposited on the patterned hard mask 2180. The patterned hard mask 2180 is subsequently removed by planarization at block 116B. In some embodiments where the liner 224 is desired, the liner 224 may be deposited over the workpiece 200 and the patterned hard mask 2180 before the deposition of the second dielectric layer 222. In some instances, the second dielectric layer 222 may also be referred to as source/drain self-aligned contact (SAC) dielectric layer 222.

Referring to FIGS. 1, 8A and 8B, after operations at block 108, method 100 may include a block 110 where the patterned hard mask 2180 is removed. In some embodiments, the patterned hard mask 2180 may be removed by one or more etch processes. The one or more etch processes may be dry etch processes that include use of a mixture of carbon tetrafluoride ($CF_4$), hydrogen ($H_2$), nitrogen ($N_2$), oxygen ($O_2$), sulfur hexafluoride ($SF_6$), or trifluoro methane ($CHF_3$). In some embodiments, operations at block 108 may include a first etch process to selectively remove the second hard mask layer 216 and a second etch process to selectively remove the first hard mask layer 214. For example, the first etch process and the second etch process may include different partial pressures or different flow rates (measured by standard cubic centimeter per minute (SCCM)) for nitrogen ($N_2$). With respect to a patterned hard mask 2180 that includes a first hard mask layer 214 formed of silicon oxide and a second hard mask layer 216 formed of silicon nitride, the first etch process may not substantially etch the first dielectric layer 209 while the second etch process may simultaneously etch the first dielectric layer 209. In these embodiments, damages to the first dielectric layer 209 at block 110 may be removed in a subsequent planarization process.

Referring to FIGS. 1, 9A and 9B, method 100 includes a block 114A where a second dielectric layer 222 is deposited over the workpiece 200. In some embodiments, the second dielectric layer 222 may include silicon carbide, lanthanum oxide, aluminum oxide, aluminum oxynitride, zirconium oxide, hafnium oxide, silicon nitride, silicon, zinc oxide, zirconium nitride, zirconium aluminum oxide, titanium oxide, tantalum oxide, yttrium oxide, tantalum carbonitride, zirconium silicide, silicon oxycarbonitride, silicon oxycarbide, silicon carbonitride, hafnium silicide, or silicon oxide. The second dielectric layer 222 may be deposited using CVD or ALD. As shown in FIGS. 9A and 9B, at block 114A, the second dielectric layer 222 is deposited directly on top surfaces and sidewalls of the first dielectric layer 209, the top surface and sidewalls of the via portion 212T, the top-facing surfaces of the base portion 212B, top surfaces of the glue layer 210, top surfaces and sidewalls of the gate SAC dielectric features 208, and sidewalls of the gate spacer layer 206.

Figure 10B:
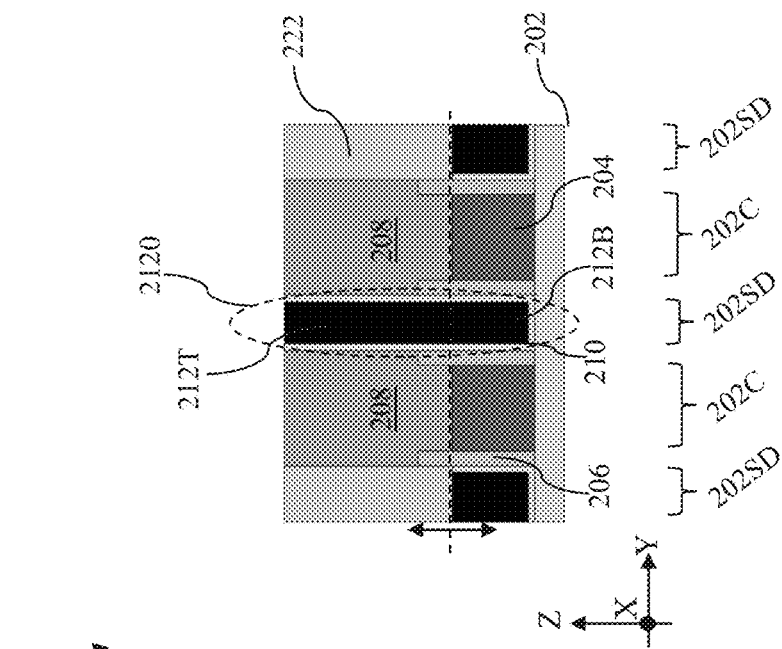
Figure 10A:
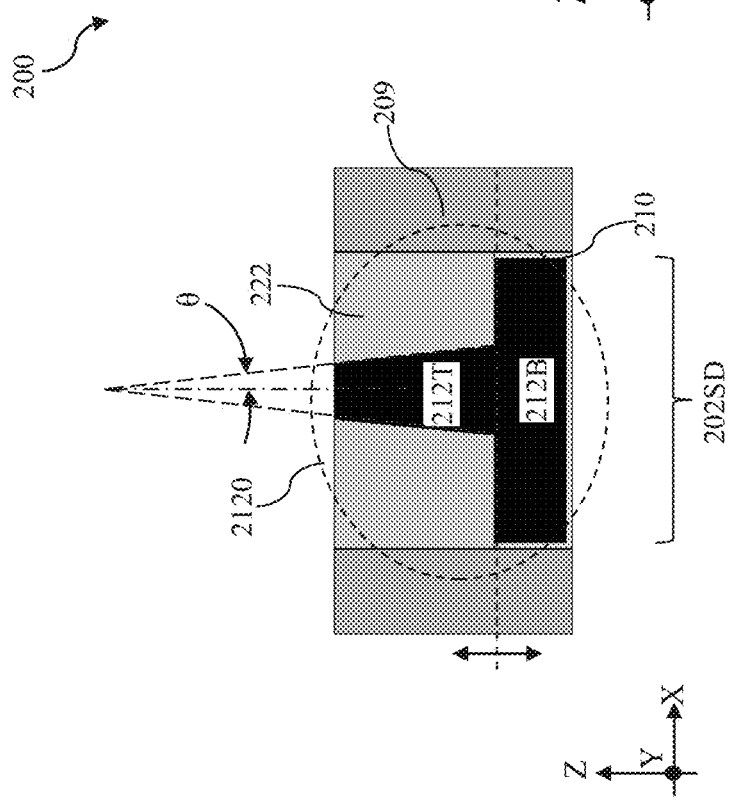

Referring to FIGS. 1, 10A and 10B, method 100 includes a block 116A where the workpiece 200 is planarized. In some embodiments, the planarization at block 116A includes a chemical mechanical polishing (CMP) process. As shown in FIGS. 10A and 10B, the planarization removes the excess second dielectric layer 222 over the via portion 212T and the gate SAC dielectric feature 208 to form a planar surface. After the planarization process, top surfaces of the first dielectric layer 209, the second dielectric layer 222, the via portion 212T, and the gate SAC dielectric feature 208 are coplanar. Because the via portion 212T is integral with the base portion 212B formed over a source/drain feature, they may be collectively referred to as a source/drain contact structure 2120. In some implementations, the via portion 212T tapers away from the base portion 212B at a taper angle θ. In some instances, the taper angle θ may be between about 2° and about 20°.

Referring to FIGS. 1, 11A and 11B, method 100 may optionally include a block 112A where a liner 224 is deposited over the workpiece 200. Block 112A may immediately follow operations at block 110 where the patterned hard mask 2180 is removed. In some embodiments, the liner 224 may include cobalt (Co), tungsten (W), ruthenium (Ru), molybdenum (Mo), titanium (Ti), titanium nitride (TiN), titanium silicide (TiSi), cobalt silicide (CoSi), nickel silicide (CiSi), tantalum nitride (TaN), nickel (Ni), or titanium silicide nitride (TiSiN). The liner 224 may be deposited using PVD, CVD, ALD, or a suitable deposition method. As shown in FIGS. 11A and 11B, at block 112A, the liner 224 is conformally deposited over surfaces of the first dielectric layer 209, the base portion 212B, the via portion 212T, and the gate SAC dielectric feature 208. In some instances, the liner 224 may have a thickness between about 0.5 nm and about 5 nm. Block 112A may be followed by blocks 114A and 116B. With the optional block 112A, block 114A deposits the second dielectric layer 222 not directly on the workpiece 200, but directly on the liner 224. Similarly, with the optional block 112A, block 116A also removes excess liner 224 by planarization, forming the planar top surface and exposing the top surface of the via portion 212T, as shown in FIGS. 12A and 12B. At this point, a source/drain contact structure 2120 that includes the via portion 212T and the base portion 212B is substantially formed. The source/drain contact structure 2120 is lined by the liner 224 is not in direct contact with the second dielectric layer 222.

Referring to FIGS. 1, 13A and 13B, after operations at block 108, method 100 may include a block 114B where the second dielectric layer 222 is deposited over the workpiece 200 without first removing the patterned hard mask 2180. As a result, the second dielectric layer 222 are in direct contact with the top surface and sidewalls of the patterned hard mask 2180. The deposition and material of the second dielectric layer 222 will not be repeated here. For the avoidance of doubts, if method 100 in FIG. 1 proceeds from block 108 to block 114B, operations at block 110 are wholly skipped as the patterned hard mask 2180 is left in place. Block 114B may be followed by block 116B, which planarizes the workpiece 200, using, for example, a CMP process. Different from the operations at block 116A, block 116B also removes the patterned hard mask 2180 by planarization, as shown in FIGS. 13A, 13B, 14A, and 14B. At this point, a source/drain contact structure 2120 that includes the via portion 212T and the base portion 212B is substantially formed. The source/drain contact structure 2120 is in direct contact with the second dielectric layer 222.

Referring to FIGS. 1, 15A and 15B, after operations at block 108 and before operations at block 114B, method 100 may optionally include a block 112B where a liner 224 is deposited over the workpiece 200. As shown in FIGS. 15A and 15B, because the patterned hard mask 2180 is not removed by block 110, the liner 224 is deposited on top surfaces and sidewalls of the patterned hard mask 2180. Because the top surface of the via portion 212T is stilled covered by the patterned hard mask 2180, at block 112B, the liner 224 is not deposited on the top surface of the via portion 212T. After block 112B, method 100 may proceed to block 114B and block 116B. Referring to FIGS. 16A and 16B, at block 114B, the second dielectric layer 222 is deposited not directly on the sidewalls of the via portion 212T and top-facing surfaces of the base portion 212B but on the liner 224A. After block 116B removes the patterned hard mask 2180, excess second dielectric layer, and excess liner 224, a planar surface is formed over the workpiece 200, as illustrated in FIGS. 17A and 17B. In some implementations, the via portion 212T tapers away from the base portion 212B at a taper angle θ. In some instances, the taper angle θ may be between about 2° and about 20°. At this point, a source/drain contact structure 2120 that includes the via portion 212T and the base portion 212B is substantially formed. The source/drain contact structure 2120 is lined by the liner 224 is not in direct contact with the second dielectric layer 222.

Referring to FIG. 1, method 100 includes block 118 where further processes are performed. The planarization at block 116A or block 116B sets the stage for further processes to be performed to the workpiece 200. Such further processes may include, for example, formation of a gate contact via to couple the gate structure 204 and formation of an interconnect structure that functionally couple to the gate contact via and the via portion 212T. The interconnect structure may include multiple conductive line layers defined in multiple intermetal dielectric (IMD) layers. The multiple conductive line layers may be connected by a plurality of vias.

The source/drain contact structure 2120 formed using methods of the present disclosure may have several detailed features, which are better illustrated in the enlarged cross-sectional view in FIG. 18. In some implementations, the via portion 212T tapers away from the base portion 212B at a taper angle θ. In some instances, the taper angle θ may be between about 2° and about 20°. The tapered profile of the via portion 212T may also be characterized by a second width W2 at the junction with the base portion 212B and a third width W3 at the top surface level of the second dielectric layer 222, both measured along the X direction. The second width W2 is greater than the third width W3. In some instances, the second width W2 is between about 3 nm and 30 and the third width W3 is between about 2 nm and about 28 nm. In some embodiments, because of the different planarization rates for different materials, the source/drain contact structure 2120 may include a tip portion 212A extending from the via portion 212T. The tip portion 212A may rise above or protrude out of the top surface of the second dielectric layer 222 by a protrusion height P. In some instances, the protrusion height P may be between 0.5 nm and 5 nm. While recesses 221 (shown in FIG. 7A) do not have an aspect ratio that is as high as a conventional contact via opening, their aspect ratios may still result in a void 226 (or an air gap 226) in the second dielectric layer 222. As shown in FIG. 18, the void 226 may have height H along the Z direction and a fourth width W4 along the X direction. In some instances, the height H may be between about 0.5 nm and about 30 nm and the fourth width W4 may be between about 0.5 nm and about 30 nm. In some implementations, the recesses 221 (shown in FIG. 7A) may extend partially into the base portion 212B. The subsequently deposited second dielectric layer 222 may also include an extension 228 that partially extend into the base portion by an extension depth E. In some instances, the extension depth E may be between about 0.5 nm and about 10 nm. Reference is made to FIG. 19, which illustrates a fragmentary top view of the via portion 212T. As shown in FIG. 19, when view along the Z direction, the via portion 212T has a first diameter R1 along the X direction and a second diameter R2 along the Y direction. The via portion 212T has an oval shape when the first diameter R1 is different from the second radius R2. The via portion 212T has a circular shape when the first diameter R1 is identical to the second diameter R2. At the interface with the base portion 212B, the first radius R1 is identical to the second width W2.

Thus, the various embodiments described herein offer several advantages over the existing art. It will be understood that not all advantages have been necessarily discussed herein, no particular advantage is required for all embodiments, and other embodiments may offer different advantages. For example, the present disclosure provides a continuous source/drain contact structure that includes a via portion and a base portion. The via portion functions as a source/drain contact via and the base portion functions as a source/drain contact. Because the via portion is integrated with the base portion without any intervening glue layer or barrier layer, the source/drain contact structure of the present disclosure offers reduced contact resistance. Formation of the source/drain contact structure of the present disclosure does not require formation of high-aspect-ratio source/drain contact via openings and deposition of materials in the high-aspect-ratio source/drain contact openings. As a result, methods of the present disclosure provide improved yield and process windows.

Thus, one of the embodiments of the present disclosure provides a semiconductor device. A semiconductor device includes an active region having a channel region and a source/drain region and extending along a first direction, and a source/drain contact structure over the source/drain region. The source/drain contact structure includes a base portion extending lengthwise along a second direction perpendicular to the first direction and a via portion over the base portion, wherein the via portion tapers away from the base portion.

In some embodiments, the via portion includes a taper angle between about 5° and about 60°. In some implementations, the via portion and the base portion are continuous and free of any intervening layer in between. In some instances, the base portion includes a first length along the second direction, the via portion includes a second length along the second direction, and the second length is smaller than the first length. In some instances, the semiconductor device may further include a first dielectric layer over sidewalls of the via portion and top surfaces of the base portion, and a second dielectric layer sandwiching the first dielectric layer and the base portion along the second direction. A composition of the first dielectric layer is different from a composition of the second dielectric layer.

In some embodiments, the semiconductor device may further include a void in the second dielectric layer. In some implementations, the second dielectric layer partially extends into the base portion. In some embodiments, a portion of the via portion rises above the second dielectric layer. In some implementations, the second dielectric layer is in direct contact with the sidewalls of the via portion and the top surfaces of the base portion.

In another of the embodiments, a semiconductor device is provided. The semiconductor device includes a first gate structure sandwiched between a first gate spacer and a second gate spacer where the first gate structure extends lengthwise along a first direction, a first gate self-aligned contact (SAC) dielectric feature over the first gate structure, the first gate spacer and the second gate spacer, a second gate structure sandwiched between a third gate spacer and a fourth gate spacer where the first gate structure extends lengthwise along the first direction, a second gate SAC dielectric feature over the second gate structure, the third gate spacer, and the fourth gate spacer, and a source/drain contact structure includes a base portion disposed between the second gate spacer and the third gate spacer and a via portion disposed between the first gate SAC dielectric feature and the second gate SAC dielectric feature. The via portion tapers away from the base portion.

In some embodiments, the via portion and the base portion are continuous and free of any intervening layer in between. In some implementations, the base portion includes a first length along a second direction perpendicular to the first direction and the via portion includes a second length along the second direction. The second length is smaller than the first length. In some embodiments, the semiconductor device may further include a liner disposed over sidewalls of the via portion and top surfaces of the base portion, and a dielectric layer disposed over the liner. In some instances, the dielectric layer includes a void. In some embodiments, the liner includes titanium nitride, tantalum nitride, or titanium silicide nitride.

In yet another of the embodiments, a method is provided. A method includes providing a conductive feature disposed in a first dielectric layer, forming a patterned hard mask layer over the conductive feature and the first dielectric layer, and etching the conductive feature using the patterned hard mask as an etch mask to form a via portion and a base portion out of the conductive feature. The base portion includes a first width and the via portion includes a second width along a direction and the first width is greater than the second width.

In some embodiments, the conductive feature is disposed over a source/drain feature of a transistor. In some implementations, the method may further include depositing a second dielectric layer over the via portion, the patterned hard mask, the base portion and the first dielectric layer, and performing a planarization process to remove the patterned hard mask such that top surfaces of the first dielectric layer, the second dielectric layer, and via portion are coplanar. In some instances, the method may further include selectively removing the patterned hard mask, depositing a second dielectric layer over the via portion, the base portion and the first dielectric layer, and performing a planarization process such that top surfaces of the first dielectric layer, the second dielectric layer, and via portion are coplanar. In some embodiments, the etching of the conductive feature includes forming a first recess and a second recess in the conductive feature, and the via portion is defined by the first recess and the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
  an active region comprising a first channel region, a second channel region and a source/drain region disposed between the first channel region and the second channel region, the active region extending along a first direction;
  a first gate structure disposed over the first channel region;
  a second gate structure disposed over the second channel region; and
  a source/drain contact structure over the source/drain region, the source/drain contact structure comprising:
    a base portion extending lengthwise along a second direction perpendicular to the first direction, and
    a via portion over the base portion, wherein the via portion tapers away from the base portion,
  wherein the base portion is disposed between the first gate structure and the second gate structure along the second direction.

2. The semiconductor device of claim 1, wherein the via portion comprises a taper angle between about 5° and about 60°.

3. The semiconductor device of claim 1, wherein the via portion and the base portion are continuous and free of any intervening layer in between.

4. The semiconductor device of claim 1,
  wherein the base portion comprises a first length along the second direction,
  wherein the via portion comprises a second length along the second direction, and
  wherein the second length is smaller than the first length.

5. The semiconductor device of claim 1, further comprising:
  a first dielectric layer over sidewalls of the via portion and top surfaces of the base portion; and
  a second dielectric layer sandwiching the first dielectric layer and the base portion along the second direction,
  wherein a composition of the first dielectric layer is different from a composition of the second dielectric layer.

6. The semiconductor device of claim 5, further comprising:
  a void in the second dielectric layer.

7. The semiconductor device of claim 5, wherein the second dielectric layer partially extends into the base portion.

8. The semiconductor device of claim 5, wherein a portion of the via portion rises above the second dielectric layer.

9. The semiconductor device of claim 5, wherein the second dielectric layer is in direct contact with the sidewalls of the via portion and the top surfaces of the base portion.

10. A semiconductor device, comprising:
  a first gate structure sandwiched between a first gate spacer and a second gate spacer, the first gate structure extending lengthwise along a first direction;

a first gate self-aligned contact (SAC) dielectric feature over the first gate structure, the first gate spacer and the second gate spacer;

a second gate structure sandwiched between a third gate spacer and a fourth gate spacer, the first gate structure extending lengthwise along the first direction;

a second gate SAC dielectric feature over the second gate structure, the third gate spacer, and the fourth gate spacer; and a source/drain contact structure comprises a base portion disposed between the second gate spacer and the third gate spacer and a via portion disposed between the first gate SAC dielectric feature and the second gate SAC dielectric feature, wherein the via portion tapers away from the base portion.

11. The semiconductor device of claim 10, wherein the via portion and the base portion are continuous and free of any intervening layer in between.

12. The semiconductor device of claim 10,
wherein the base portion comprises a first length along a second direction perpendicular to the first direction,
wherein the via portion comprises a second length along the second direction, and
wherein the second length is smaller than the first length.

13. The semiconductor device of claim 10, further comprising:
a liner disposed over sidewalls of the via portion and top surfaces of the base portion; and
a dielectric layer disposed over the liner.

14. The semiconductor device of claim 13, wherein the dielectric layer comprises a void.

15. The semiconductor device of claim 13, wherein the liner comprises titanium nitride, tantalum nitride, or titanium silicide nitride.

16. A method, comprising:
providing a conductive feature disposed in a first dielectric layer;
forming a patterned hard mask layer over the conductive feature and the first dielectric layer; and
etching the conductive feature using the patterned hard mask as an etch mask to form a via portion and a base portion out of the conductive feature,
wherein the base portion comprises a first width and the via portion comprises a second width along a direction,
wherein the first width is greater than the second width.

17. The method of claim 16, wherein the conductive feature is disposed over a source/drain feature of a transistor.

18. The method of claim 16, further comprising:
depositing a second dielectric layer over the via portion, the patterned hard mask, the base portion and the first dielectric layer; and
performing a planarization process to remove the patterned hard mask such that top surfaces of the first dielectric layer, the second dielectric layer, and via portion are coplanar.

19. The method of claim 16, further comprising:
selectively removing the patterned hard mask;
depositing a second dielectric layer over the via portion, the base portion and the first dielectric layer; and
performing a planarization process such that top surfaces of the first dielectric layer, the second dielectric layer, and via portion are coplanar.

20. The method of claim 16,
wherein the etching of the conductive feature comprises forming a first recess and a second recess in the conductive feature, and
wherein the via portion is defined by the first recess and the second recess.

* * * * *